United States Patent [19]

Iijima et al.

[11] Patent Number: 5,017,308
[45] Date of Patent: May 21, 1991

[54] SILICON THIN FILM AND METHOD OF PRODUCING THE SAME

[75] Inventors: Shigeru Iijima, Matsudo; Kazunobu Tanaka, Niihari; Akihisa Matsuda, Yatabe; Mitsuo Matsumura, Kasukabe; Hideo Yamamoto, Ohi, all of Japan

[73] Assignee: Toa Nenryo Kogyo K.K., Tokyo, Japan

[21] Appl. No.: 377,985

[22] Filed: Jul. 11, 1989

Related U.S. Application Data

[63] Continuation-in-part of Ser. No. 689,036, Jan. 7, 1985, abandoned, which is a continuation of Ser. No. 562,688, Dec. 19, 1983, abandoned, which is a continuation-in-part of Ser. No. 394,996, Jun. 11, 1982, abandoned.

[30] Foreign Application Priority Data

Oct. 15, 1980 [JP] Japan ................... 55-143010
Oct. 15, 1981 [JP] Japan ............ PCT/JP81/00286

[51] Int. Cl.$^5$ ............... H01C 13/00; H01C 31/0392
[52] U.S. Cl. ................. 252/501.1; 136/258; 252/62.3 R; 252/62.3 E; 148/33.2; 427/39; 427/255.2; 437/4; 437/101; 437/113; 357/59; 428/620
[58] Field of Search ............. 427/39, 74, 255.2; 437/4, 101, 113; 136/258 AM, 258 PC; 148/33.2; 428/620; 357/59 C, 59 D; 252/62.3 E, 62.3 R, 501.1

[56] References Cited

U.S. PATENT DOCUMENTS 4,409,134 10/1983 Yamazaki .................. 252/501.1
4,433,202 2/1984 Maruyama et al. ............... 136/255

OTHER PUBLICATIONS

A. Matsuda et al, *Jap. J. Appl. Phys.*, vol. 19, Jun. 1980, pp. L305-L308.

*Primary Examiner*—Aaron Weissstuch
*Attorney, Agent, or Firm*—Seidel, Gonda, Lavorgna & Monaco

[57] ABSTRACT

A silicon thin film is composed of primarily silicon atoms, 0 to 8 atm % hydrogen, at least one element selected from the group including fluorine, chlorine, bromine and iodine, and an impurity element, wherein about 80 to 100% of microcrystalline grains are interspersed in an amorphous phase. The thin film is produced by deposition on a substrate in a plasma atmosphere using as a raw material gas silane ($SiH_4$) or halogenated silane ($SiH_{0-3}X_{4-1}$) wherein X represents a halogen or a combination of two or more halogens, and a dopant gas mixed with the raw material gas. The method comprises the steps of: (1) diluting the mixed gas with hydrogen in a ratio of the diluting gas to the raw material gas of from 50:1 to 100:1, to control the film deposition rate to produce a layer including mixed crystalline and amorphous substances; and (2) applying an electric power to provide a plasma discharge power density of from 0.1 to about 0.5 W/cm$^2$, at a reaction pressure of 5 to 10 torr.

13 Claims, 7 Drawing Sheets

SILICON THIN FILM AND METHOD OF PRODUCING THE SAME

CROSS REFERENCES

This is a continuation-in-part of copending U.S. application Ser. No. 689,036, filed Jan. 7, 1985, now abandoned, which is a continuation of U.S. application Ser. No. 562,688 filed Dec. 19, 1983, now abandoned, which is a continuation-in-part of U.S. application Ser. No. 394,996, filed June 11, 1982, now abandoned.

TECHNICAL FIELD

This invention relates to a silicon thin film and a method of producing the same, and particularly, to a low resistance silicon thin film which is formed on an appropriate substrate in a plasma atmosphere, and a method of producing the same.

BACKGROUND OF THE INVENTION

It is well known to form a silicon thin film on an appropriate substrate in a plasma atmosphere, using as a raw material a mixture of silane ($SiH_4$) and a dopant material. The conventional silicon thin film produced by such method is entirely amorphous. The amorphous film exhibits a halo pattern by X-ray diffraction, and such amorphous silicon thin film has an electrical conductivity of at most about $10^{-2}$ $\Omega^{-1}$ $cm^{-1}$ for the N type and about $10^{-3}$ $\Omega^{-1}$ $cm^{-1}$ for the P type. The activation energy which is estimated on the basis of the temperature dependence of the electrical conductivity is approximately 0.2 eV both for P type and N type films. Thus, it is difficult to characterize the amorphous thin film as a P+ or N+ type film which provides ohmic contact to metal and in which the Fermi level is adequately degenerated (for example, see the *Philosophical Magazine*, Vol. 33, p. 935, 1976). Especially, in the case of a P type film, as the electrical conductivity becomes higher, the optical band gap is sharply reduced (see the *Physical Review*, Vol. 19, p.2041, 1979). As a result, in a P-N or P-I-N junction structure for solar cells, due to the reduction of the, optical band gap of the P type layer, the light is absorbed by the P type layer before it arrives at the active region of the junction (P and N or P and I interface). Moreover, the difference of band gap between the P and I layers produces a heterojunction which causes smaller built-in potential and open circuit voltage. On the other hand, in an N type layer, the fill factor (curve factor of efficiency) decreases because of poor ohmic contact to metal and high series resistance. These facts mean that eventually the conversion efficiency of the light to electricity is lowered.

On the other hand, while polycrystalline thin films which are produced of silane ($SiH_4$) as by a chemical vapor deposition have higher electrical conductivities, they have optical band gaps as low as 1.2 eV, which is lower than the optimum valve of about 1.5 eV which matches well with solar spectrum. Further, the grain boundaries between crystals not only act as recombination centers of electron-hole pairs, but also cause the leakage of current.

DETAILED DESCRIPTION OF THE INVENTION

It is an object of the invention to provide a silicon thin film, which has a low electrical resistance and adequately wide optical band gaps, with the combined advantages of the amorphous silicon thin films and the polycrystalline silicon thin films.

It is a further object of the invention to provide a silicon thin film which has crystalline grains in a specific range of diameters, a high electrical conductivity and a wide optical band gap.

It is a still further object of the invention to provide a P type silicon thin film, which has a high electrical conductivity, a wide band gap, and an excellent doping efficiency, which has so far been difficult to obtain.

It is a still further object of the invention to provide an N type silicon thin film, which has a high electrical conductivity and an excellent doping efficiency, which also has so far been difficult to obtain.

It is a still further object of the invention to provide a method of producing a silicon thin film having a low resistance and a wide band gap on an appropriate substrate in a plasma atmosphere.

It is a still further object of the invention to provide a silicon thin film which has a specified proportion of microcrystalline grains in the amorphous substance thereof, has a high electrical conductivity and a wide optical band gap.

The silicon thin film according to this invention is composed primarily of silicon atoms, at least one element selected from the group of fluorine, chlorine, bromine and iodine, and hydrogen, as well as an impurity element. The silicon thin film is characterized by the regularity of the arrangement of atoms and by a microcrystalline substance interspersed in the amorphous layer. Especially, according to the present invention the content of hydrogen is in the range of from 0 to 8 atm % (atomic percentage), preferably from 2 to 5 atm % and the content of the microcrystalline grains is in the range of from 80 to 100% by volume.

In brief, the present silicon thin film comprises a substrate and a film deposited on the substrate, said film comprising primarily silicon atoms, 0 to 8 atm %, preferably 2 to 5 atm % of hydrogen, at least one element selected from the group consisting of fluorine, chlorine, bromine and iodine, and an impurity element, wherein 80 to 100% microcrystalline grains are interspersed in an amorphous phase.

Particularly, on X-ray diffraction, the usual amorphous silicon thin films which are prepared under a plasma atmosphere exhibit a wide and gently-sloping halo pattern and a spectrum which does not have any sharp peaks, while the polycrystalline silicon thin films which are prepared by chemical vapor deposition, high temperature annealing, etc. exhibit a clear and intensive peak which is derived from the silicon crystal lattice.

On the other hand, the present inventors have discovered that the silicon thin films having microcrystalline grains interspersed in the amorphous layer show a weak peak near Si(111) or Si(220) on the halo pattern, which is presumably derived from the silicon crystal lattice. The average crystallite size in the silicon thin film can be calculated from the breadth of a diffraction pattern at points of half maximum intensity using Scherrer's equation and it ranges from about 30 Å to about 500 Å. The microcrystalline substance in this range of crystallite size does not provide any optical interference with the light in the range of wave lengths involved in the solar radiation, and can only cause the electrical conductivity to increase.

It is deduced that the microcrystalline substance having the average crystallite size below about 30 Å will hardly continue to exist and tend to lose the characteristics of a crystal and thus change into an amorphous substance, while the microcrystalline substance having the average grain diameter over about 500 Å A will tend to change into a polycrystalline one, so that an interference of light occurs at the boundary between the amorphous phase and the crystallites, and thus, it would be impossible in these ranges to lower the electrical resistance without narrowing down the optical band gap. Thus, the most desirable range of average crystallite size for the silicon thin film to have a low electrical resistance and a wide optical bandgap is about 150 Å to about 500 Å.

Further, the proportion of the microcrystalline substance in the amorphous substance can be estimated from the X-ray diffraction pattern on the basis of the height of the peak and the breadth at half maximum intensity. According to the present invention, as mentioned above, the proportion of the microcrystalline substance in the amorphous substance is in the range of from 80 to 100% by volume.

The inventors of the present invention have discovered that when the proportion of microcrystalline substance is over about 80% by volume and the content of hydrogen in the film falls below about 8 atm %, the crystallinity in the film is promoted to obtain a high electrical conductivity. The present invention is based on this novel finding.

The present invention may provide N type silicon thin films having an electrical conductivity of more than about $1 \times 10^2 \, \Omega^{-1} \, cm^{-1}$ and P type silicon thin films having an electrical conductivity of more than about $5 \times 10^0 \, \Omega^{-1} \, cm^{-1}$. On the other hand, when the proportion of the microcrystalline substance is below about 80% by volume, the electrical conductivity falls below $5 \times 10^0 \, \Omega^{-1} \, cm^{-1}$ for N type silicon thin films and $5 \times 10^{-1} \, \Omega^{-1} \, cm^{-1}$ for P type silicon thin films.

It is deduced with the silicon thin film according to this invention that the existence of the microcrystalline substance in the amorphous layer may closely relate to the fact that the film has the combined excellent features of an amorphous silicon thin film such as an adequately wide optical band gap, and of a polycrystalline silicon thin film, such as a remarkably high electrical conductivity.

In this invention, various elements can be used as an impurity dopant. Particularly, when elements in Group V of the Periodic Table, such as phosphorus, arsenic, etc., are used, silicon thin films having the property of an N type semiconductor are obtained, while the use of elements in Group III of the Periodic Table, such as boron, aluminium, etc. will provide a silicon thin film having the property of a P type semiconductor. The former films are characterized by an electrical conductivity of more than about $1 \times 10^2 \, \Omega^{-1} \, cm^{-1}$, while the latter films are characterized by a conductivity of more than about $5 \times 10^0 \, \Omega^{-1} \, cm^{-1}$. Thus there can be produced silicon thin films having N type or P type conductivity, which are characterized by an activation energy on the basis of the electrical conductivity below about 0.2 eV, often below about 0.1 eV, a good doping efficiency, an adequately degenerated Fermi level, and an excellent ohmic contact to metal. Further, the silicon thin films according to this invention, either of N type or P type, can maintain an adequately wide optical band gap, and they have a considerably higher optical band gap value of about 1.3 eV to about 1.8 eV in comparison with the value of about 1.2 of the polycrystalline films. Especially, the P type thin films have the two combined excellent characteristics of high electrical conductivity and wide optical band gap, which could not have been obtained in the conventional films. These advantages substantiate the premise that the silicon thin films according to this invention are of a novel crystalline construction which is not completely amorphous and not completely polycrystalline, and particularly in which more than 80% microcrystalline grains are interspersed in an amorphous phase.

Next, the method of making the silicon thin film according to this invention will be explained. First, any one of silane ($SiH_4$) or halogenated silane ($SiH_{0-3}X_{4-1}$) (X represents a halogen element), or a gas mixture including two or more of these gases is diluted with hydrogen gas in a ratio of the diluting gas to the raw material gas of 50:1 to 100:1, and then a dopant gas is added to the diluted gas mixture. The sequence of mixing and dilution is not limited to this one. Electric power having a plasma discharged power density of 0.1 to 0.5 W/cm² at a reaction pressure of 5 to 10 torr is applied to the gas mixture to produce a plasma condition, in which a film is formed on a substrate (consisting of glass, plastic, metal, etc.). Then, the impurity atoms acting as dopants are efficiently incorporated into a silicon network with four coordinations, so that a silicon thin film having a high electrical conductivity can be formed without decreasing the optical band gap. The purpose of diluting the silane ($SiH_4$) with hydrogen in a high proportion of 50-100:1 is to control the film deposition rate under the applied low electrical power at a high reaction pressure.

Particularly, in order to produce the present silicon thin film, the ratio of dilution of hydrogen ($SiH_4/H_2$) is controlled within the range of 1/50 to 1/100, the reaction pressure (film forming pressure) 5 to 10 torr and the electric power supplied (cathode electric power density) 0.1 to 0.5 W/cm². If the silicon film is produced under a high electric power such as 0.8 to 1.6 W/cm² and a low reaction pressure of less than 1 torr, particles with high energy such as cracked ionic species ($SiH_x^+$ and $H^+$) and electrons impinge against the layer surface produced, so that the percent of microcrystalline substance is less than about 80%.

In contrast, according to the present invention, the film forming pressure is increased by about a factor of ten and the cathode electric power density is reduced below about 0.5 W/cm² so as to bring about the reduction of impingement of ions and electrons and the increase of the ratio of the microcrystalline substance in the amorphous phase.

More particularly, one of silane or halogenated silane or a gas mixture including two or more of these gases is diluted with hydrogen gas in a ratio of the diluting gas to the raw material gas of more than 50:1, preferably in a ratio of 50:1 to 100:1. If the ratio of the dilution does not attain 50:1, the desired proportion of microcrystalline substance cannot be obtained. Namely, in order to promote the crystallinity of the silicon thin film it is required to increase the concentration of hydrogen on the surface of the film being manufactured. A ratio of hydrogen dilution over 50:1 can attain the objects of this invention.

The X-ray diffraction pattern from the film which has been produced under such conditions shows that microcrystalline grains are interspersed in the amorphous substance, and it is deduced that the existence of such microcrystalline grains remarkably reduces the resistance of the film while giving the film the optical properties of an amorphous film. According to the X-ray diffraction pattern, average crystallite size of such grains is in the range of about 30 Å to about 500 Å, and especially in the range of about 150 Å to about 500 Å.

BEST MODE OF CARRYING OUT THE INVENTION

Next, the characteristics of the silicon thin film according to this invention and examples of the method of making the film will be described in connection with the drawings.

Figure 1:
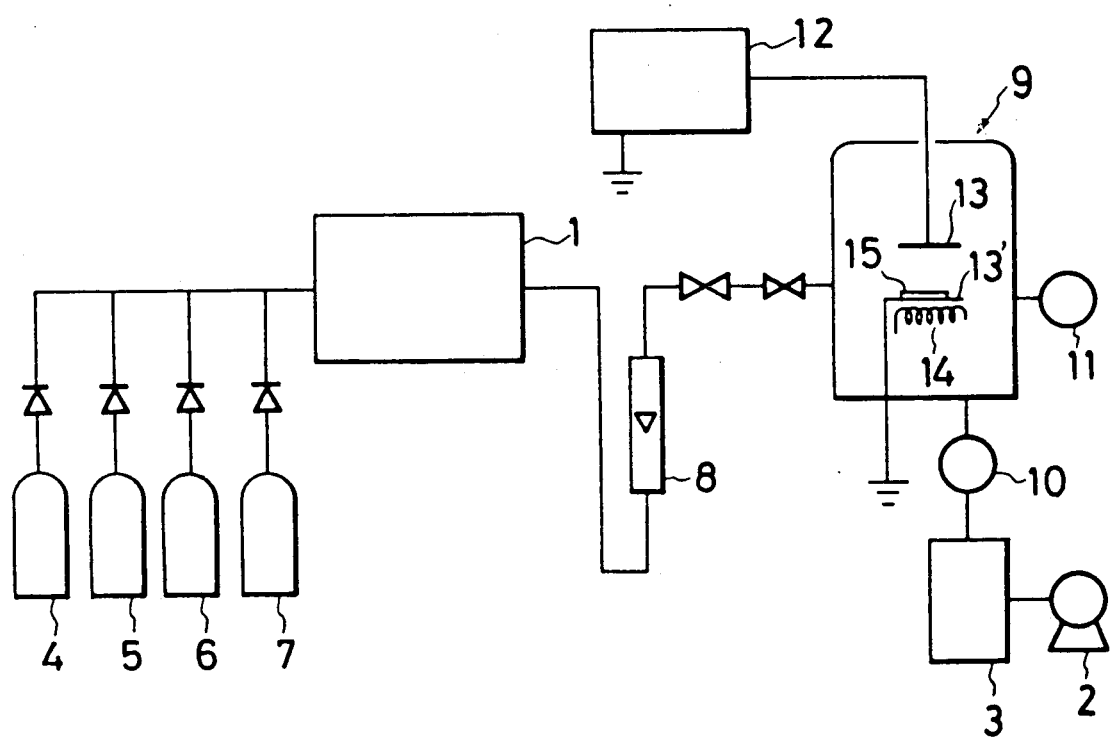
FIG. 1 is a schematic view showing an example of an apparatus for carrying out the method of making silicon thin films according to this invention.

Referring to FIG. 1, the whole system including a mixing chamber 1 is evacuated to a degree of vacuum of about $10^{-6}$ torr using a rotary oil pump 2 and an oil diffusion pump 3, and gases are introduced from a silane cylinder 4 and a hydrogen cylinder 5, and from dopant gas cylinder 6 or 7 as required, to the mixing chamber 1 at a required proportion and are mixed there. The gas mixture is supplied through a flow rate meter 8 to an evacuated chamber 9 at a predetermined flow rate. The pressure or degree of vacuum within the chamber 9 is maintained at a required value by manipulating a main valve 10 while observing a vacuum meter 11. A high frequency voltage is applied across electrodes 13 and 13' to produce a glow discharge. A substrate 15 is placed on a substrate holder which is heated by a heater 14, to a required temperature. Thus, a doped hydrogenated silicon thin film is produced on the plate 15.

Table I illustrates the examples of the method of producing the conventional amorphous films (hereinafter referred to as "conventional amorphous films") and silicon thin films having less than 80% of microcrystalline grains interspersed in an amorphous phase (hereinafter referred to as "conventional mixed-phase films"), and the characteristics of the films formed. Table II illustrates the examples of the method of producing films according to this invention and the characteristics of the formed films in comparison with the conventional methods and films.

In Table I, the samples designated by Nos. 1 to 8 are conventional P type amorphous films and the samples designated Nos. 9 to 12 are conventional P type mixed-phase films. The samples designated by Nos. 13 to 17 and 19 are conventional N type amorphous films, the samples designated by Nos. 18 and 20 to 22 conventional N type mixed-phase films, and the sample designated by No. 23 an I type mixed-phase film. Further, Table I describes film preparation conditions and film characteristics thereof as well.

On the other hand, in Table II the samples designated by Nos. 30 and 31 are P type silicon thin films which were prepared using the method of this invention. In these examples, the silane (SiH$_4$) was diluted with hydrogen at a ratio of hydrogen to silane of 100:1 and a low electric power of 0.2 W/cm$^2$ at a high reaction pressure of 0.5 torr, was applied. The samples designated by Nos. 32 and 33 are N type silicon thin films which were prepared according to this invention and there are described film preparation conditions and film characteristics thereof. In Nos. 32 and 33, the silane (SiH$_4$) was diluted with hydrogen at a ratio of hydrogen to silane of 80:1, and a low electric power of 0.2 W/cm$^2$ at a high reaction pressure of 5.0 torr was applied.

In the examples, the content of the microcrystalline substance in the mixed amorphous and microcrystalline layer was estimated by the following procedure.

First, prior to annealing, a sample was evaluated for the peak height which was obtained by X ray diffraction. Next, the sample was annealed at a temperature of 700° C. for an hour, and the peak height at about $2\theta = 27°-28°$ which was obtained by the X ray diffraction was used as a reference, that is 100 percent. The volume fraction of the microcrystalline phase was computed as the ratio of the peak height prior to the annealing to that after the annealing.

Figure 2:
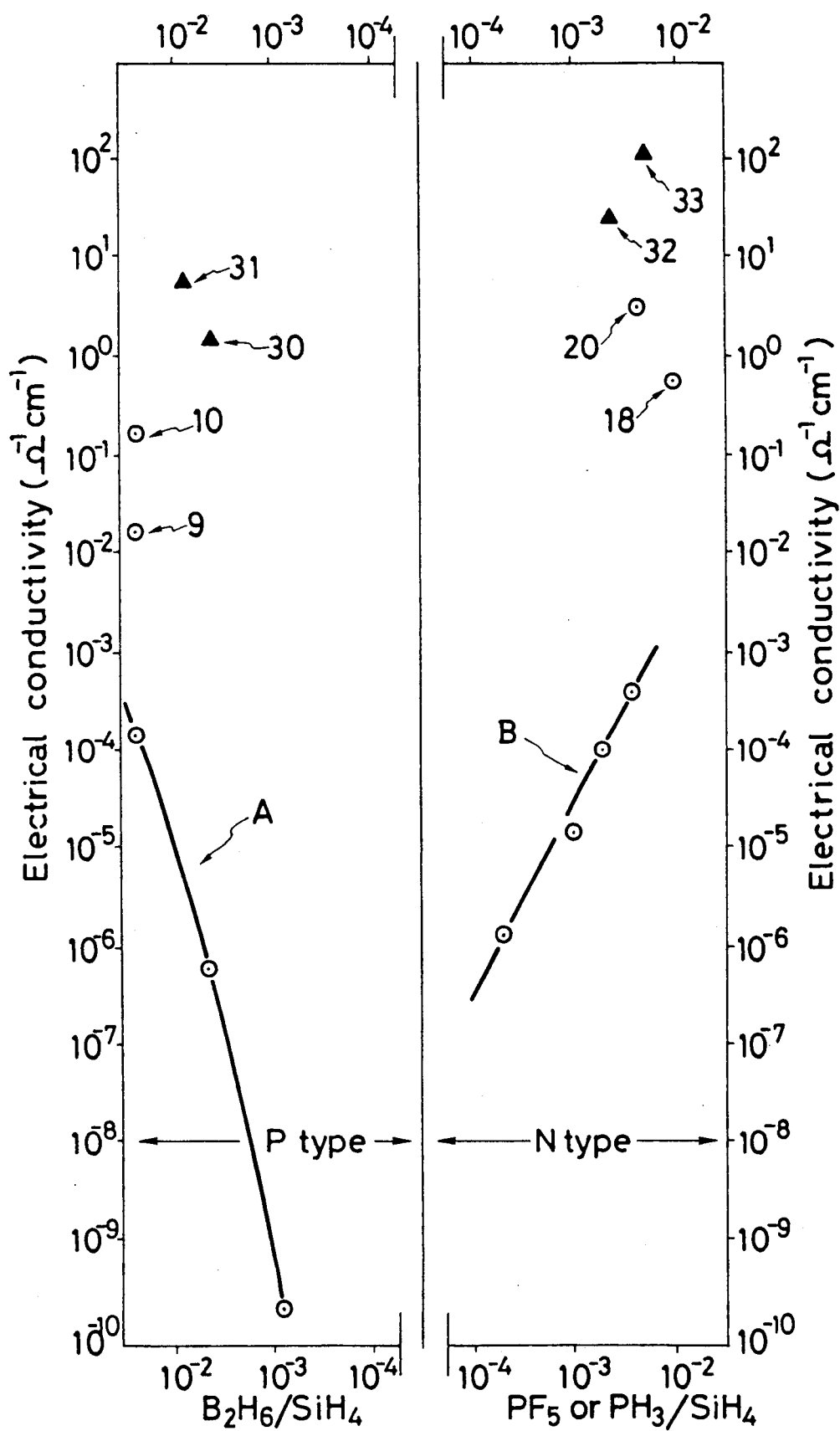
FIGS. 2 to 5 are graphs showing the characteristics of the silicon thin films according to this invention.

FIG. 2 is a graph showing the electrical conductivity of the silicon thin films according to this invention as a function of the concentration of dopant gas. In FIG. 2, the curves A and B show the electrical conductivity of the conventional P type and N type amorphous films respectively, produced by the conventional method, in which the films were formed at a cathode plasma discharge power density (Plasma discharge power/area of cathode electrode) of about 0.1 W/cm$^2$. The points 9 and 10 show the electrical conductivity of the conventional P type mixed-phase films of sample Nos. 9 and 10, respectively in which the silane (SiH$_4$) was diluted with hydrogen at a ratio of silane to hydrogen of 1:30, and 2% by volume of diborane (B$_2$H$_6$) to silane was added to the gas mixture while plasma discharge power densities of 0.8 W/cm$^2$ and 1.6 W/cm$^2$, respectively were applied. The points 18 and 20 in FIG. 2 show the conductivity of the N type silicon thin films of sample Nos. 18 and 20, respectively, in which silane was diluted with hydrogen at a ratio of silane to hydrogen of 1:10, and for the point 18, 1% by volume of phosphorus pentafluoride (PF$_5$), and for the point 20, 4500 ppm by volume of phosphine (PH$_3$) were added while power densities of 0.8 W/cm$^2$ and 1.6 W/cm$^2$, respectively, were used. The points 30 and 31 in FIG. 2 show the electrical conductivity of the P type silicon thin films produced by the method of this invention, in which the silane (SiH$_4$) was diluted with hydrogen at a ratio of silane to hydrogen of 1:100, and for the point 30, 2000 ppm by volume of diborane (B$_2$H$_6$) and for the point 31, 5000 ppm by volume of diborane (B$_2$H$_6$) were added to the gas mixture while a plasma discharge power density of 0.2 W/cm$^2$ at a reaction pressure of 5.0 torr was applied. The points 32 and 33 in FIG. 2 show the conductivity of the N type silicon thin films produced by the method of this invention, in which silane was diluted with hydrogen at a ratio of silane to hydrogen of 1:80, and for the point 32, 2000 ppm by volume of phosphine PH$_3$), and for the point 33, 5000 ppm by volume of phosphine (PH$_3$) were added while a power density of 0.2 W/cm$^2$ at a reaction pressure of 5.0 torr was used. It is clear from FIG. 2 that the conductivity of the silicon thin films of this invention is increased at least by one order of magnitude in comparison with that of the conventional mixed-phase films.

Figure 3:
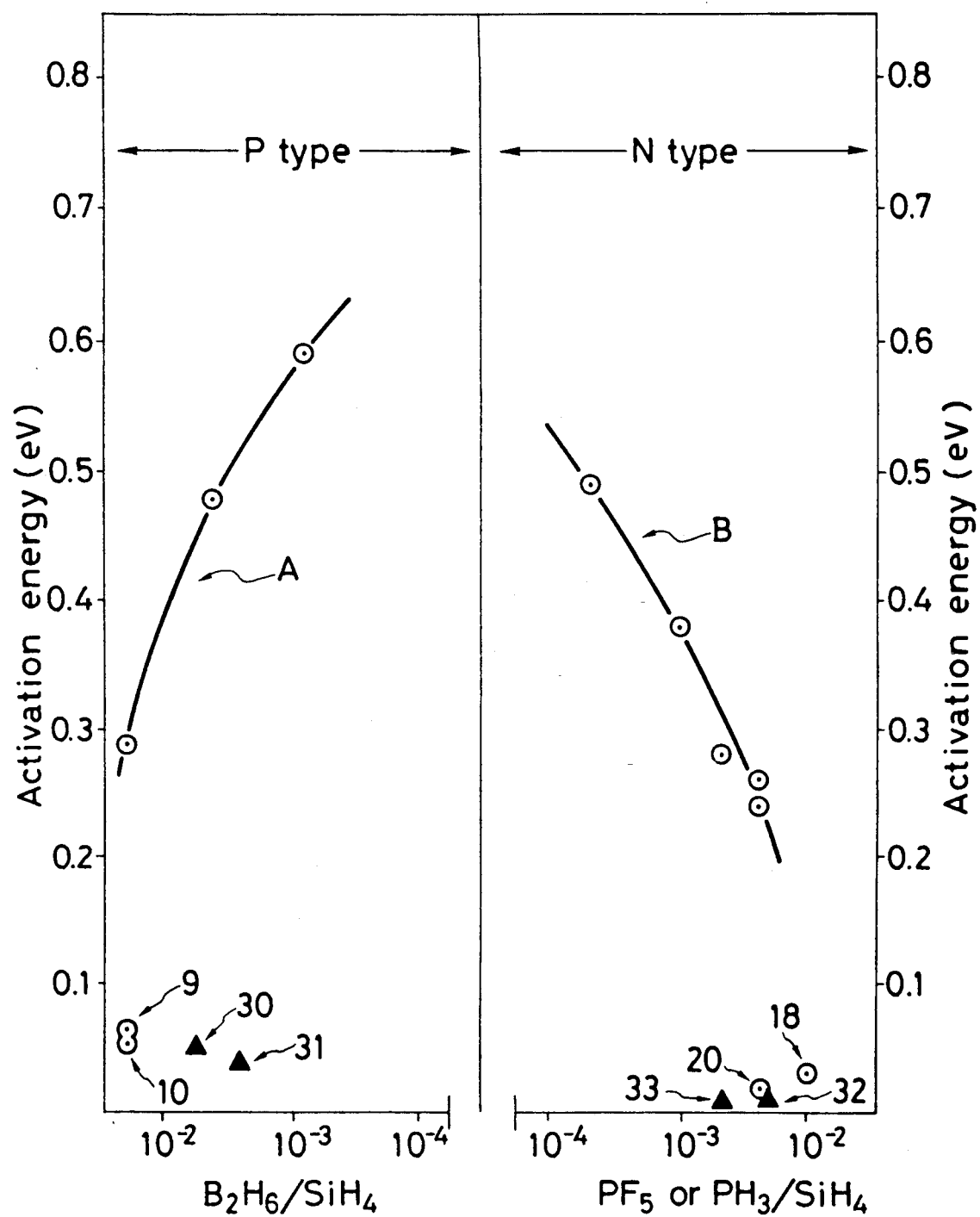

FIG. 3 shows the activation energy on the basis of the electrical conductivity of the films of this invention as a function of the concentration of dopant gas. The curves A and B in FIG. 3 represent the activation energy of the conventional amorphous films. The points 9, 10, 18 and 20 represent the activation energy of the conventional mixed-phase films of sample Nos. 9, 10, 18 and 20, respectively. The points 30, 31, 32 and 33 represent the activation energy of the films produced by this invention, in which the film preparation conditions corresponding to the points 30, 31, 32 and 33 in FIG. 2 were used, respectively. FIG. 3 substantiates that this invention provides a P+ type or N+ type film having a sufficiently low activation energy on the basis of electric conductivity, a good ohmic contact to metal, and an adequately degenerated Fermi level.

Figure 4:
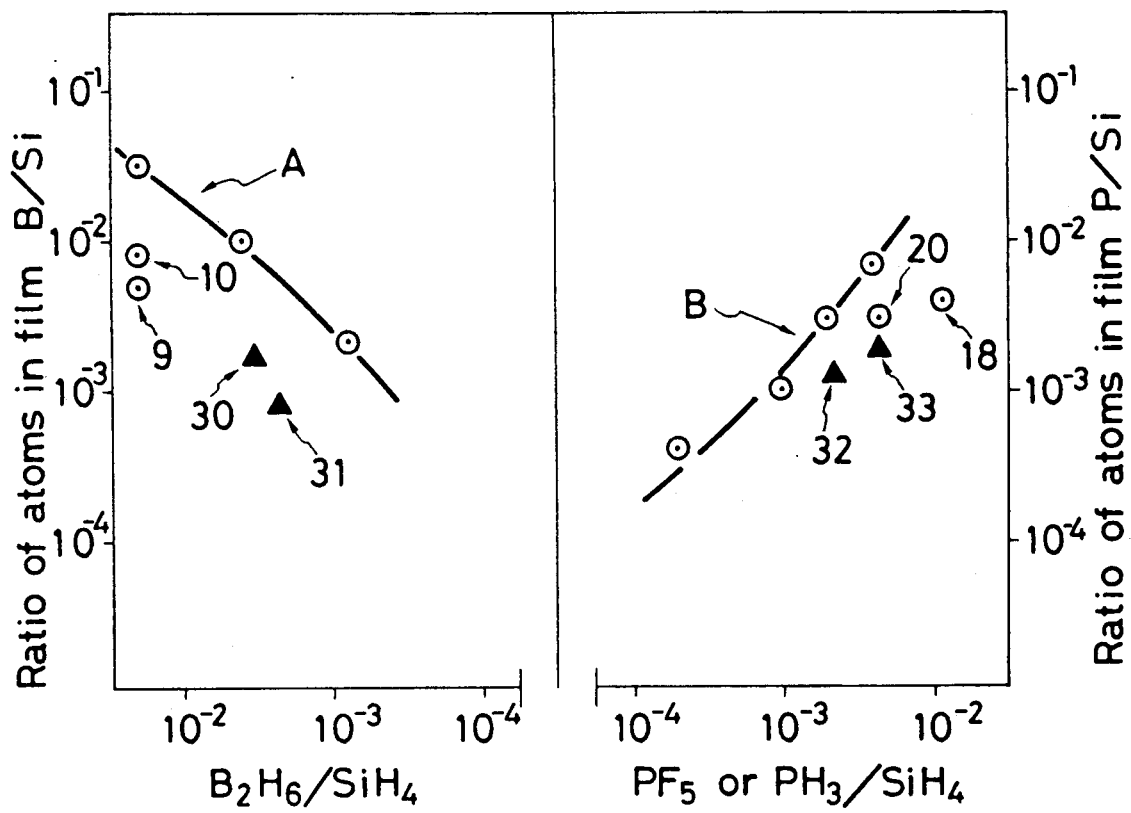

FIG. 4 is a graph showing the concentrations of boron and phosphorus in the silicon thin films of this invention as a function of the concentration of dopant gas, as measured by the SIMS and EPMA methods. The curves A and B represent the conventional amorphous films produced by the conventional methods, in which the film preparation conditions corresponding to the curves A and B in FIG. 2 were used. The points 9, 10, 18 and 20 in FIG. 4 represent the conventional mixed-phase films of sample Nos. 9, 10, 18 and 20, respectively.

FIG. 4 shows that the concentration of boron and phosphorus in the silicon thin films of this invention is lower than that of the conventional amorphous films, and substantiates that the film of this invention has an excellent characteristic and the method according to this invention brings about an excellent doping efficiency.

Figure 5:
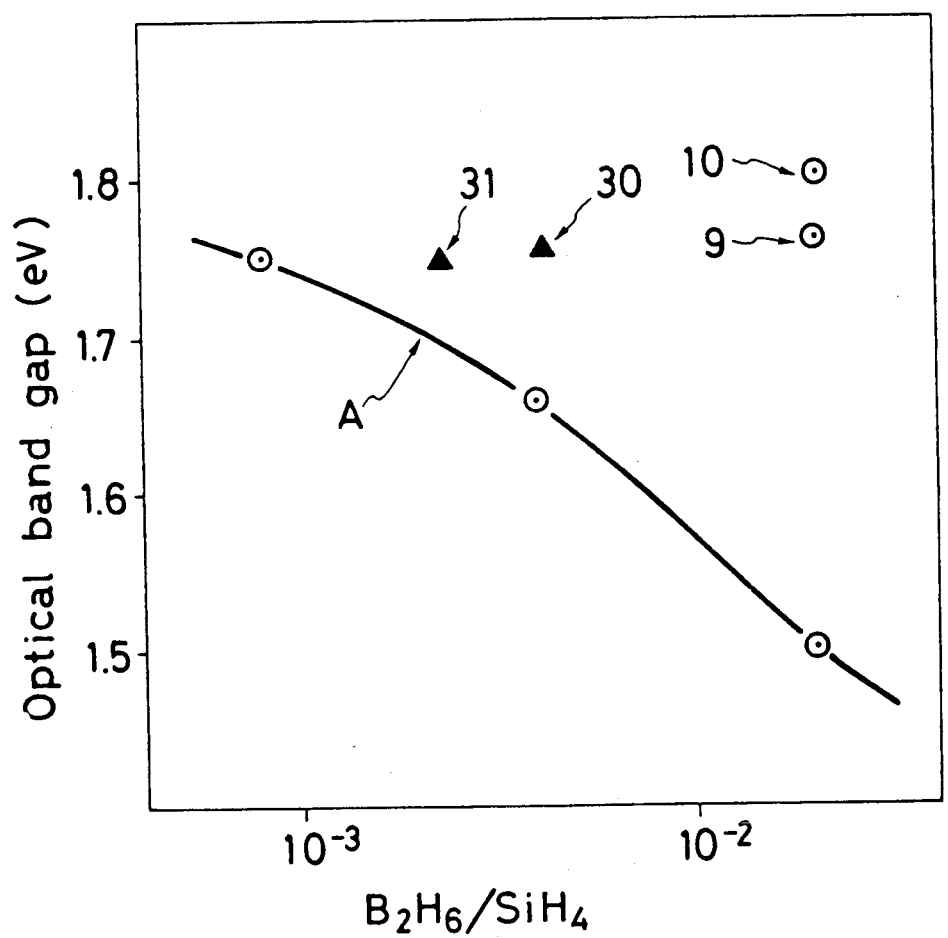

FIG. 5 shows the optical band gap of the P type silicon thin film of this invention as a function of the concentration of dopant gas. The optical band gap is calculated on the basis of $\sqrt{\alpha\nu} \propto (h\nu - E_o)$, wherein o represents the absorption coefficient; hv the incident photon energy (eV); and $E_o$ the optical band gap. The curve A in FIG. 5 is related to the conventional amorphous films produced by the conventional method, in which the film preparation conditions corresponding to the curve A in FIG. 2 were used. It shows that as the concentration of boron increases, the optical band gap decreases. On the other hand, the points 30 and 31 are concerned with the silicon films of this invention, in which the film preparation conditions corresponding to the points 30 and 31 in FIG. 2 were applied, respectively. FIG. 5 shows that the P type silicon thin films of this invention have a high electrical conductivity without the optical band gap being narrowed.

Figure 6:
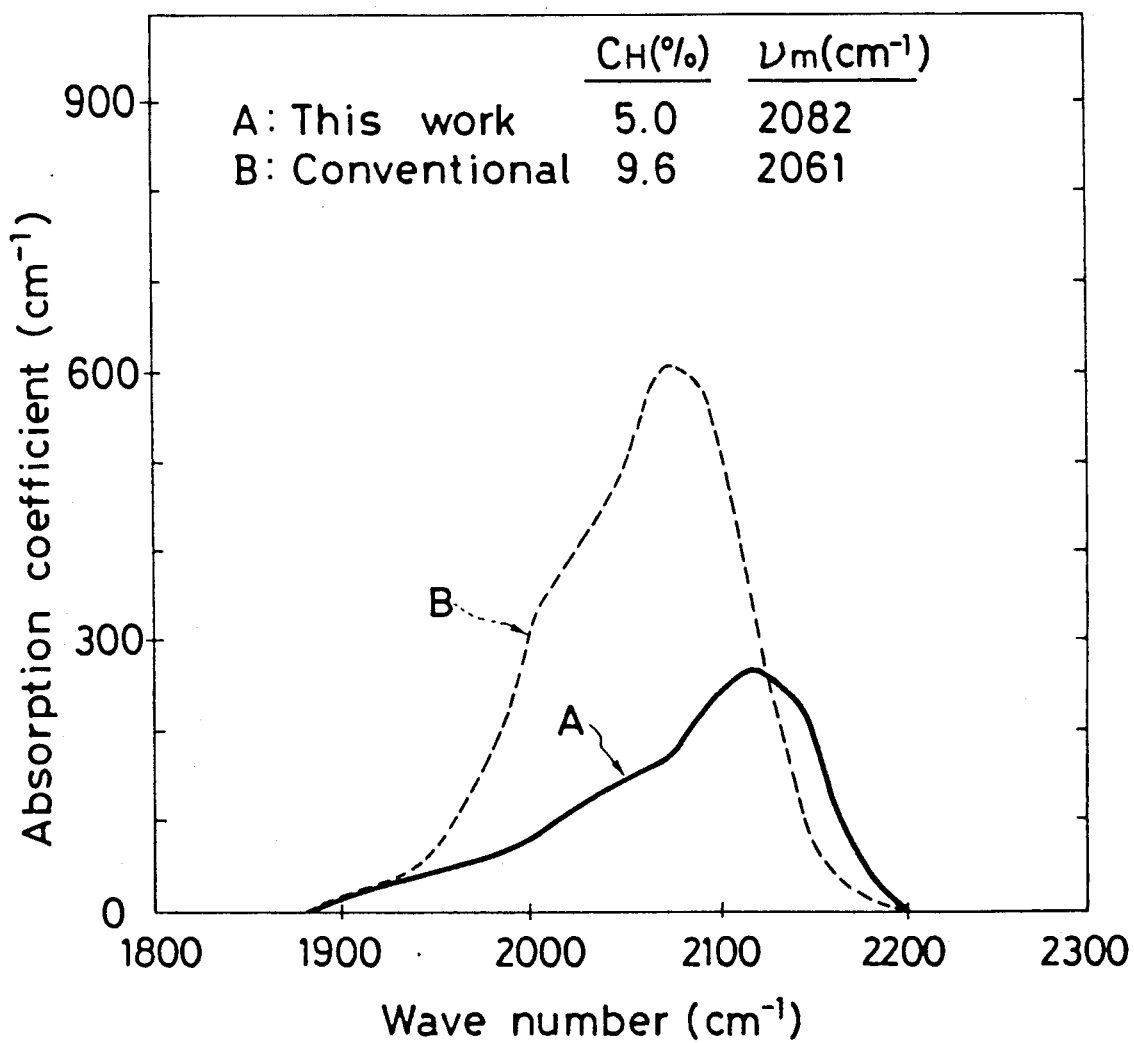
FIG. 6 is a diagram showing the infrared absorption spectra of a silicon thin film according to this invention.

FIG. 6 shows an example of the infrared absorption spectrum of the silicon thin film of this invention in comparison with the conventional. The curve A in FIG. 6 is the present silicon thin film designated by sample No. 33 and curve B in FIG. 6 is the conventional mixed-phase film designated by sample No. 18.

FIG. 6 makes it clear that the content of hydrogen in the film of this invention is less than 5 atm % whereas that in the conventional mixed-phase film is about 10 atm %.

TABLE (I)-1

| No. of samples | 1 | 2 | 3 | 4 | 5 | 6 | 7 | 8 |
|---|---|---|---|---|---|---|---|---|
| Composition of gas (volume ratio) | $SiH_4/H_2$ = 1/1 | 1/1 | 1/1 | 1/10 | 1/10 | 1/20 | 1/20 | 1/20 |
| Proportion of doping gas (ppm by vol.) | $\frac{B_2H_6}{SiH_4}$ = 800 | 4,000 | 20,000 | 20,000 | 20,000 | 10,000 | 10,000 | 10,000 |
| Gas flow rate (SCCM) | 15 | 15 | 15 | 15 | 15 | 15 | 15 | 15 |
| Cathode electric power density (W/cm$^2$) | 0.1 | 0.1 | 0.1 | 0.4 | 1.6 | 0.4 | 1.6 | 1.0 |
| Temperature of substrate (°C.) | 300 | 300 | 300 | 300 | 300 | 300 | 300 | 300 |
| Film forming pressure (torr) | $5 \times 10^{-2}$ | $5 \times 10^{-2}$ | $5 \times 10^{-2}$ | $2 \times 10^{-1}$ | $1 \times 10^{-1}$ | $1 \times 10^{-1}$ | $1 \times 10^{-1}$ | $1 \times 10^{-1}$ |
| Film thickness ($\mu$m) | 1.0 | 1.1 | 1.0 | 1.0 | 1.2 | 0.9 | 1.1 | 0.8 |
| Film forming rate (Å/sec) | 0.93 | 1.1 | 0.93 | 1.2 | 2.0 | 0.8 | 1.7 | 1.2 |
| Electrical conductivity ($\Omega^{-1}$ cm$^{-1}$) | $2.13 \times 10^{-10}$ | $6.0 \times 10^{-7}$ | $1.39 \times 10^{-4}$ | $2.5 \times 10^{-3}$ | $1.6 \times 10^{-5}$ | $8.5 \times 10^{-3}$ | $1.4 \times 10^{-3}$ | $1.8 \times 10^{-3}$ |
| Activation energy (eV) | 0.59 | 0.48 | 0.29 | 0.18 | 0.35 | 0.12 | 0.18 | 0.16 |
| Band gap (eV) | 1.75 | 1.66 | 1.50 | 1.68 | 1.62 | 1.65 | 1.65 | 1.65 |
| Crystal grain diameter (Å) | — | — | — | 80 | 150 | 100 | 100 | 100 |
| Content of microcrystalline (% by volume) | 0 | 0 | 0 | 35 | <30 | 40 | 35 | 35 |
| Type of conductivity by measuring electromotive force | | | | P type | | | | | ciency.

TABLE (I)-2

| No. of samples | 9 | 10 | 11 | 12 | 13 | 14 | 15 | 16 |
|---|---|---|---|---|---|---|---|---|
| Composition of gas (volume ratio) | 1/30 | 1/30 | 1/30 | 1/40 | $SiH_4/H_2$ = 1/1 | 9/1 | 9/1 | 9/1 |

TABLE (I)-2-continued

| No. of samples | 9 | 10 | 11 | 12 | 13 | 14 | 15 | 16 |
|---|---|---|---|---|---|---|---|---|
| Proportion of doping gas (ppm by vol.) | 20,000 | 20,000 | 10,000 | 20,000 | $\frac{PF_5}{SiH_4} = 200$ | 1,000 | 2,000 | 4,000 |
| Gas flow rate (SCCM) | 19 | 19 | 20 | 20 | 4 | 4 | 4 | 8 |
| Cathode electric power density (W/cm$^2$) | 0.8 | 1.6 | 0.8 | 1.6 | 0.14 | 0.14 | 0.14 | 0.06 |
| Temperature of substrate (°C.) | 300 | 300 | 300 | 300 | 320 | 320 | 320 | 320 |
| Film forming pressure (torr) | 1.0 | 1.0 | 1.0 | >1.0 | $5 \times 10^{-2}$ | $5 \times 10^{-2}$ | $5 \times 10^{-2}$ | $1 \times 10^{-1}$ |
| Film thickness (μm) | 1.4 | 1.7 | 1.1 | 0.9 | 1.2 | 0.83 | 0.84 | 0.80 |
| Film forming rate (Å/sec) | 1.3 | 1.6 | 0.6 | 1.0 | 0.92 | 0.77 | 0.78 | 0.56 |
| Electrical conductivity ($\Omega^{-1} cm^{-1}$) | $1.56 \times 10^{-2}$ | $1.55 \times 10^{-1}$ | $2.3 \times 10^{-1}$ | $4.1 \times 10^{-1}$ | $1.38 \times 10^{-6}$ | $1.43 \times 10^{-5}$ | $1.03 \times 10^{-4}$ | $94 \times 10^{-4}$ |
| Activation energy (eV) | 0.060 | 0.056 | 0.050 | 0.040 | 0.49 | 0.38 | 0.28 | 0.24 |
| Band gap (eV) | 1.76 | 1.80 | 1.75 | 1.80 | 1.74 | 1.74 | 1.73 | 1.75 |
| Crystal grain diameter (Å) | 60 | 50 | 70 | 60 | — | — | — | — |
| Content of microcrystalline (% by volume) | 60 | 70 | 70 | 60 | 0 | 0 | 0 | 0 |
| Type of conductivity by measuring electromotive force | | | | | P type | | | |

TABLE (I)-3

| No. of samples | 17 | 18 | 19 | 20 | 21 | 22 | 23 |
|---|---|---|---|---|---|---|---|
| Composition of gas (volume ratio) | 1/5 | 1/10 | 9/1 | 1/10 | 1/20 | 1/30 | 1/30 |
| Proportion of doping gas (ppm by vol.) | 10,000 | 10,000 | $\frac{PH_3}{SiH_4} = 4,000$ | 1,500 | 10,000 | 10,000 | — |
| Gas flow rate (SCCM) | 10 | 12 | 8 | 10 | 10 | 20 | 10 |
| Cathode electric power density (W/cm$^2$) | 0.4 | 0.8 | 0.06 | 1.6 | 0.8 | 0.8 | 0.8 |
| Temperature of substrate (°C.) | 260 | 280 | 320 | 280 | 300 | 300 | 300 |
| Film forming pressure (torr) | $2 \times 10^{-1}$ | 1.0 | $1 \times 10^{-1}$ | 1.0 | $1 \times 10^{-1}$ | $1 \times 10^{-1}$ | 1.0 |
| Film thickness (μm) | 0.95 | 1.1 | 0.76 | 0.70 | 0.85 | 0.80 | 0.99 |
| Film forming rate (Å/sec) | 1.1 | 1.9 | 0.53 | 3.9 | 0.80 | 0.55 | 1.0 |
| Electrical conductivity ($\Omega^{-1} cm^{-1}$) | $3.6 \times 10^{-3}$ | $5.04 \times 10^{-1}$ | $3.00 \times 10^{-4}$ | $2.77 \times 10^{0}$ | $3.1 \times 10^{0}$ | $6.0 \times 10^{0}$ | $5 \times 10^{-4}$ |
| Activation energy (eV) | 0.15 | 0.031 | 0.26 | 0.022 | 0.020 | 0.018 | 0.3 |
| Band gap (eV) | 1.75 | 1.78 | 1.72 | 1.73 | 1.72 | 1.75 | 1.63 |
| Crystal grain diameter (Å) | 100 | 120 | — | 120 | 100 | 100 | 120 |
| Content of microcrystalline (% by volume) | 37 | 55 | 0 | 60 | 60 | 60 | 60 |
| Type of conductivity by measuring electromotive force | | | | N type | | | I type |

TABLE (II)

| No. of samples | 30 | 31 | 32 | 33 | 34 |
|---|---|---|---|---|---|
| Composition of gas (volume ratio) | SiH$_4$/H$_2$ = 1/100 | 1/100 | SiH$_4$/H$_2$ = 1/80 | 1/80 | 1/100 |

TABLE (II)-continued

| No. of samples | 30 | 31 | 32 | 33 | 34 |
| --- | --- | --- | --- | --- | --- |
| Proportion of doping gas (ppm by vol.) | $\frac{B_2H_6}{SiH_4} = 2,000$ | 5,000 | $\frac{PH_3}{SiH_4} = 2,000$ | 5,000 | — |
| Gas flow rate (SCCM) | 50 | 50 | 50 | 50 | 50 |
| Cathode electric power density (W/cm$^2$) | 0.2 | 0.2 | 0.2 | 0.2 | 0.2 |
| Temperature of substrate (°C.) | 250 | 250 | 250 | 250 | 250 |
| Film forming pressure (torr) | 5.0 | 5.0 | 5.0 | 5.0 | 5.0 (665 Pa) |
| Film thickness ($\mu$m) | 1.1 | 0.95 | 0.80 | 0.85 | 1.0 |
| Film forming rate (Å/sec) | 0.35 | 0.33 | 0.25 | 0.27 | 0.25 |
| Electrical conductivity ($\Omega^{-1}$cm$^{-1}$) | $1.1 \times 10^0$ | $6.8 \times 10^0$ | $1.8 \times 10^1$ | $1.2 \times 10^2$ | $1 \times 10^{-3}$ |
| Activation energy (eV) | 0.030 | 0.021 | 0.015 | 0.012 | 0.27 |
| Band gap (eV) | 1.76 | 1.74 | 1.74 | 1.75 | 1.76 |
| Crystal grain diameter (Å) | 180 | 150 | 180 | 200 | 150 |
| Content of microcrystalline (% by volume) | 80 | 85 | 85 | 85 | |
| Type of conductivity by measuring electromotive force | P type | P type | N type | N type | I type |

Figure 7:
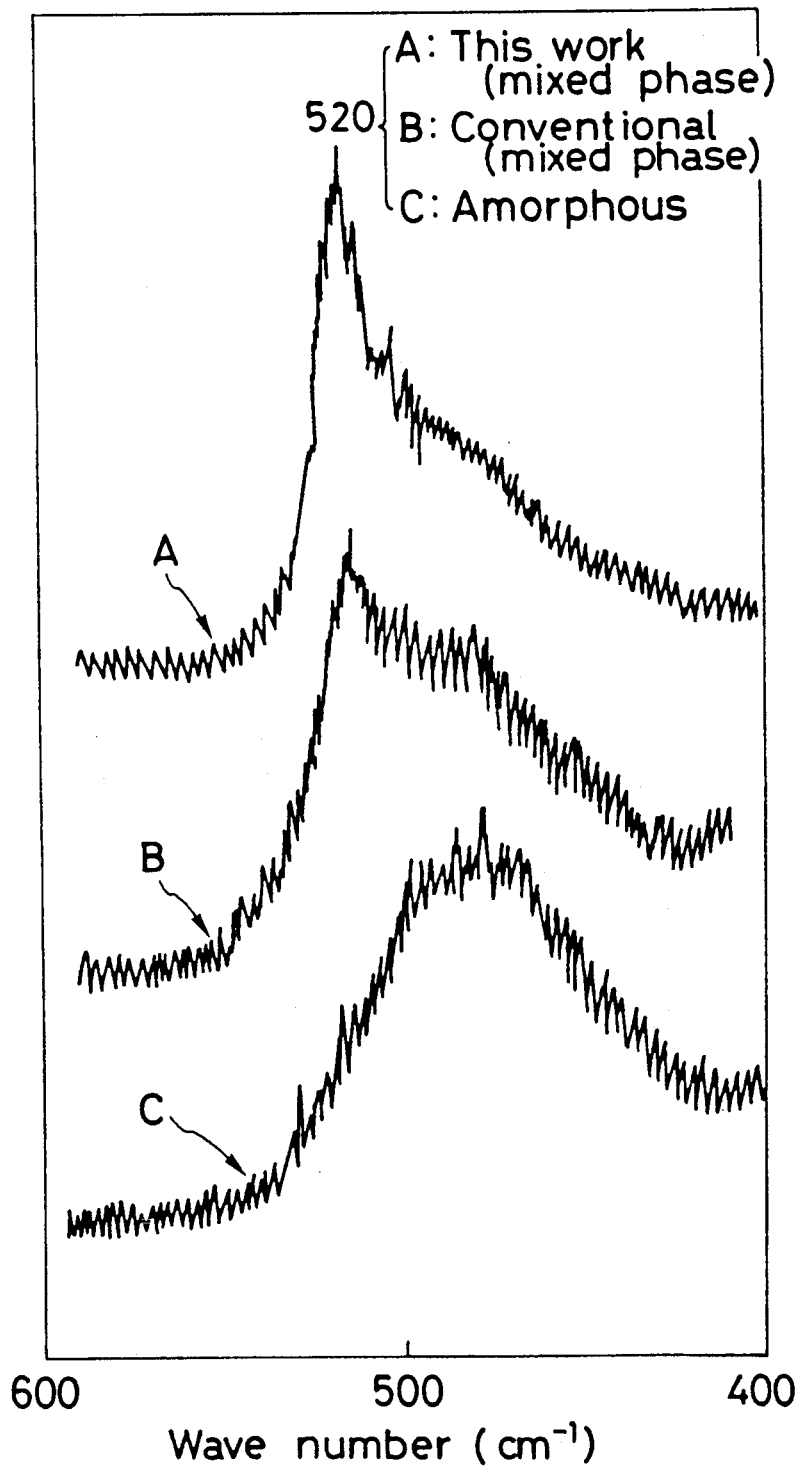
FIG. 7 is the Raman spectrum of a silicon thin film according to this invention.

FIG. 7 shows the Raman spectra of the silicon thin film of the present invention and the conventional. The curve A represents the present silicon thin film designated by sample No. 33, the curve B the conventional mixed-phase film designated by sample No. 18, and the curve C the conventional amorphous film designated by sample No. 16.

Clearly, it can be observed in FIG. 7 that the silicon thin film according to the present invention has a strong peak of the microcrystalline phase at wave number 520 cm$^{-1}$ in comparison with the conventional. This means that the present silicon thin film has more than 80% of crystallinity. The crystallinity of the conventional mixed-phase film represented by curve B was about 55%.

Industrial Applicability

According to this invention, there can be provided P type and N type silicon thin films having a high doping efficiency and a high electrical conductivity, which have a wide application. Especially, the P type silicon thin films are useful for solar cells and the like, since it can provide a high electrical conductivity without the optical band gap being narrowed. Thus, this invention has great advantages when used in the electronic industries.

Further, though the present invention has been described above with respect to P type and N type silicon thin films having a high electrical conductivity, this invention is not limited to those silicon thin films but undoped silicon thin films, that is, I type silicon thin films with superior properties in comparison with the conventional ones, can be suitably and efficiently provided (refer to sample No. 34 in Table II as prepared according to this invention in comparison with the conventional film, sample No. 23).

What is claimed is:

1. A substrate and a silicon thin film deposited on said substrate, said thin film having an electrical conductivity of more than $5 \times 10^0$ $\Omega^{-1}$cm$^{-1}$ for a P type film and more than $1 \times 10^2$ $\Omega^{-1}$cm$^{-1}$ for an N type film, said film comprising primarily silicon atoms, 2 to 5 atm % of hydrogen, fluorine and a dopant impurity element, wherein at least about 80%, but less than 100%, of the film volume comprises microcrystalline grains, which grains are interspersed in an amorphous phase.

2. The combination according to claim 1, wherein the optical band gap of said film is higher than 1.3 eV.

3. The combination according to claim 1, wherein the average crystallite size is about 30 Å to about 500 Å.

4. The combination according to claim 3, wherein the average crystallite size is about 150 Å to about 500 Å.

5. The combination according to claim 1, wherein the dopant impurity element is at least one element selected from Group V of the Periodic Table.

6. The combination according to claim 1, wherein the dopant impurity element is at least one element selected from Group III of the Periodic Table.

7. The combination according to claim 1, wherein the activation energy on the basis of the electrical conductivity of said film is below about 0.2 eV.

8. Method of preparing a silicon thin film on a substrate in a plasma atmosphere using as a raw material gas silane (SiH$_4$), fluorinated silane (SiH$_{0.3}$F$_{4.1}$), or a combination thereof, and a dopant gas mixed with the raw material gas, said method comprising:

diluting said mixed gas with hydrogen in a ratio of the diluting gas to the raw material gas of from 50:1 to 100:1; and applying an electric power to provide a plasma discharge power density of about 0.1 to about 0.5 W/cm$^2$ at a reaction pressure of 5 to 10 torr, whereby the produced film contains 2 to 5 atm % of hydrogen, and at least about 80%, but less than 100%, of the film volume comprises microcrystalline grains, which grains are interspersed in an amorphous phase.

9. Method according to claim 8, wherein said dopant gas includes a gas comprising at least one element selected from Group III of the Periodic Table, or compounds thereof, and the resulting silicon thin film is of the P type.

10. Method according to claim 8, wherein said dopant gas includes a gas comprising at least one element selected from Group V of the Periodic Table, or compounds thereof, and the resulting silicon thin film is of the N type.

11. A substrate and a silicon thin film deposited on said substrate, said film comprising primarily silicon atoms, 2 to 5 atm % of hydrogen, and fluorine, wherein at least about 80%, but less than 100% of the film volume comprises microcrystalline grains having an average crystallite size from about 30 Å to about 500 Å, which grains are interspersed in an amorphous phase.

12. The combination according to claim 11, wherein the average crystallite size is about 150 Å to about 500 Å.

13. Method of preparing a silicon thin film on a substrate in a plasma atmosphere using as a raw material gas silane ($SiH_4$), fluorinated silane ($SiH_{0.3}F_{4-1}$), or a combination thereof, said method comprising:

diluting said mixed gas with hydrogen in a ratio of the diluting gas to the raw material gas of from 50:1 to 100:1; and applying an electric power to provide a plasma discharge power density of about 0.1 to about 0.5 W/cm$^2$ at a reaction pressure of 50 to 10 torr, whereby the produced film contains 2 to 5 atm % of hydrogen and at least about 80%, but less than 100% by volume of microcrystalline grains, which grains are interspersed in an amorphous phase.

* * * * *

UNITED STATES PATENT AND TRADEMARK OFFICE
CERTIFICATE OF CORRECTION

PATENT NO. : 5,017,308
DATED : May 21, 1991
INVENTOR(S) : Shigeru Iijima, et. al.

It is certified that error appears in the above-indentified patent and that said Letters Patent is hereby corrected as shown below:

Title page, item [73], Assignee: add the following--Tonen Kabushiki Kaisha, Tokyo Japan and Japan as Represented by Director General of Agency of Industrial Science and Technology, Tokyo Japan--.

Signed and Sealed this

Twentieth Day of June, 1995

Attest:

BRUCE LEHMAN

Attesting Officer    Commissioner of Patents and Trademarks